(12) United States Patent
Val et al.

(10) Patent No.: US 8,264,853 B2
(45) Date of Patent: Sep. 11, 2012

(54) 3D ELECTRONIC MODULE

(75) Inventors: Christian Val, St Remy les Chevreuse (FR); Olivier Lignier, Versailles (FR)

(73) Assignee: 3D Plus, Buc Cedex (FR)

( * ) Notice: Subject to any disclaimer, the term of this patent is extended or adjusted under 35 U.S.C. 154(b) by 1050 days.

(21) Appl. No.: 12/095,157

(22) PCT Filed: Nov. 30, 2006

(86) PCT No.: PCT/EP2006/069164
§ 371 (c)(1), (2), (4) Date: May 28, 2008

(87) PCT Pub. No.: WO2007/063113
PCT Pub. Date: Jun. 7, 2007

(65) Prior Publication Data
US 2008/0316727 A1    Dec. 25, 2008

(30) Foreign Application Priority Data
Nov. 30, 2005 (FR) .................................. 05 12169

(51) Int. Cl.
*H01R 12/16* (2006.01)

(52) U.S. Cl. ........ 361/790; 361/785; 361/735; 361/736; 174/250; 174/256

(58) Field of Classification Search ................. 361/793, 361/760, 767, 795; 174/250, 256
See application file for complete search history.

(56) References Cited

U.S. PATENT DOCUMENTS

| | | |
|---|---|---|
| 4,216,444 A | 8/1980 | Vergnolle et al. |
| 4,408,256 A | 10/1983 | Val |
| 4,413,170 A | 11/1983 | Val et al. |
| 4,518,818 A | 5/1985 | Le Ny et al. |
| 4,546,028 A | 10/1985 | Val |
| 4,553,020 A | 11/1985 | Val |
| 4,559,579 A | 12/1985 | Val |
| 4,639,826 A | 1/1987 | Val et al. |
| 4,654,694 A | 3/1987 | Val |
| 4,755,910 A | 7/1988 | Val |
| 5,002,895 A | 3/1991 | LeParquier et al. |

(Continued)

FOREIGN PATENT DOCUMENTS
EP        0810649       12/1997
(Continued)

OTHER PUBLICATIONS

U.S. Appl. No. 07/728,325, filed Jul. 8, 1991, Christian Val, abandoned Dec. 10, 1992.

(Continued)

*Primary Examiner* — Yuriy Semenenko
*Assistant Examiner* — Andargie M Aychillhum
(74) *Attorney, Agent, or Firm* — Lowe, Hauptman, Ham & Berner LLP

(57) ABSTRACT

The invention relates to a 3D electronic module comprising a stack (100) of at least a first slice (10) and a second slice (30), the first slice (10) having on a face (101) at least one set (4) of electrically conductive protrusions (41), and the second slice (30) comprising at least one zone (61) of electrically insulating material, traversing the thickness of the slice. The second slice (30) comprises at least one electrically conductive element (3) traversing said slice in a zone (61) of electrically insulating material, able to receive a set (4) of protrusions (41) of the first slice (10).

26 Claims, 1 Drawing Sheet

U.S. PATENT DOCUMENTS

| | | | |
|---|---|---|---|
| 5,237,204 | A | 8/1993 | Val |
| 5,323,533 | A | 6/1994 | Val |
| 5,400,218 | A | 3/1995 | Val |
| 5,461,545 | A | 10/1995 | Leroy et al. |
| 5,526,230 | A | 6/1996 | Val |
| 5,637,536 | A | 6/1997 | Val |
| 5,640,760 | A | 6/1997 | Val et al. |
| 5,847,448 | A | 12/1998 | Val et al. |
| 5,885,850 | A | 3/1999 | Val |
| 6,307,261 | B1 | 10/2001 | Val et al. |
| 7,218,527 | B1 * | 5/2007 | Jacobsen ............... 361/737 |
| 2003/0013231 | A1 | 1/2003 | Val |
| 2003/0173673 | A1 | 9/2003 | Val |
| 2004/0082100 | A1 * | 4/2004 | Tsukahara et al. ........... 438/106 |
| 2004/0110323 | A1 | 6/2004 | Becker et al. |
| 2005/0012188 | A1 | 1/2005 | Val |
| 2007/0117369 | A1 | 5/2007 | Val et al. |
| 2007/0262443 | A1 | 11/2007 | Val et al. |

FOREIGN PATENT DOCUMENTS

| | | |
|---|---|---|
| EP | 0844657 | 5/1998 |
| EP | 1137066 | 9/2001 |
| WO | WO03063242 | 7/2003 |
| WO | WO2004059720 | 7/2004 |

OTHER PUBLICATIONS

U.S. Appl. No. 12/095,157, filed May 28, 2008, Christian Val et al.
U.S. Appl. No. 89361, filed Oct. 30, 1979, Christian Val, abandoned Feb. 27, 1981.
U.S. Appl. No. 148043, filed Feb. 8, 1982, Christian Val, abandoned Feb. 8, 1982.
U.S. Appl. No. 201870, filed Nov. 3, 1980, Christian Val et al., abandoned Nov. 9, 1990.
U.S. Appl. No. 221437, filed Dec. 30, 1980, Herve Lacroix et al., abandoned Jun. 30, 1982.
U.S. Appl. No. 274205, filed Jan. 4, 1984, Jacques Le Ny et al., abandoned Dec. 2, 1993.
U.S. Appl. No. 296650, filed Aug. 27, 1981, Christian Val, abandoned Jan. 4, 1984.
U.S. Appl. No. 507808, filed Jun. 24, 1983, Christian Val, abandoned Sep. 26, 1985.
U.S. Appl. No. 735731, filed May 20, 1985, Christian Val,, abandoned Dec. 7, 1987.
U.S. Appl. No. 131238, filed Dec. 7, 1987, Christian Val, abandoned Jun. 2, 1981.
U.S. Appl. No. 361694, filed Jun. 2, 1989, Christian Val, abandoned Jun. 2, 1991.
U.S. Appl. No. 030854, filed May 12, 1987, Christian Val, abandoned Mar. 1, 1988.
U.S. Appl. No. 226512, filed Aug. 1, 1988, Christian Val, abandoned Nov. 15, 1989.
U.S. Appl. No. 920073, filed Oct. 16, 1986, Christian Val, abandoned Sep. 22, 1989.
U.S. Appl. No. 026228, filed Jan. 29, 1987, Christian Val, abandoned Apr. 2, 1996.
U.S. Appl. No. 092295, filed Sep. 2, 1987, Christian Val et al., abandoned Jan. 12, 1989.
U.S. Appl. No. 296797, filed Jan. 12, 1989, Christian Val et al., abandoned Sep. 15, 1989.
U.S. Appl. No. 407532, filed Sep. 15, 1989, Christian Val et al., abandoned May 21, 1990.
U.S. Appl. No. 527714, filed May 21, 1990, Christian Val et al., abandoned Oct. 28, 1991.
U.S. Appl. No. 181740, filed Apr. 14, 1988, Guy Pasquier et al., abandoned Nov. 3, 1989.
U.S. Appl. No. 272376, filed Nov. 17, 1988, Christian Val, abandoned Jul. 8, 1991.
U.S. Appl. No. 07/728,352, filed Jul. 8, 1991, Christian Val, abandoned Dec. 10, 1992.
U.S. Appl. No. 07/989,871, filed Dec. 10, 1992, Christian Val, abandoned Aug. 13, 1993.
U.S. Appl. No. 07/844,631, filed Aug. 23, 1991, Michel Leroy, abandoned Mar. 30, 1992.
U.S. Appl. No. 07/920,482, filed Dec. 6, 1991, Christian Val, abandoned Aug. 6, 1992.
U.S. Appl. No. 08/289,855, filed Aug. 12, 1994, Christian Val, abandoned Aug. 12, 1994.
U.S. Appl. No. 08/604,752, filed Feb. 23, 1996, Christian Val, abandoned Jun. 12, 1998.
U.S. Appl. No. 08/351,407, filed Apr. 15, 1994, Christian Val, abandoned Sep. 4, 1996.
U.S. Appl. No. 08/544,478, filed Oct. 18, 1995, Stephan Ronan et al., abandoned Mar. 3, 1997.
U.S. Appl. No. 11/910,433, filed Apr. 1, 2008, Val et al.

* cited by examiner

3D ELECTRONIC MODULE

CROSS-REFERENCE TO RELATED APPLICATIONS

The present application is based on International Application No. PCT/EP2006/069164, filed on Nov. 30, 2006, which in turn corresponds to French Application No. 0512169, filed on Nov. 30, 2005, and priority is hereby claimed under 35 USC §119 based on these applications. Each of these applications are hereby incorporated by reference in their entirety into the present application.

TECHNICAL FIELD

The field of the invention is that of three-dimensional (3D) electronic modules.

BACKGROUND OF THE INVENTION

A 3D electronic module comprises a stack of electronic slices. A slice 5, an example of which is shown in FIG. 1, generally comprises one or more active 1c, 1b, or passive 1a components which have electrical connection elements 2c, 2b or 2a running over one of the faces 51 of the slice, the components being clad with an electrically insulating resin 6. One or more electrically conductive tracks 7 situated on the same face 51 connect these components to each other or connect them to electrical connection elements of slices between them or to connection elements of the slice to an interconnecting circuit.

It is known to electrically connect the slices to each other by conductors situated on the lateral faces of the stack, that is to say on the edges 52 of the slices.

This results in a great length of electrical connection for connecting two components, notably when they are respectively situated at the center of two slices. The longer the connection becomes, the longer the connection time increases, which globally reduces the performance of the 3D module.

Moreover, the number of conductors situated on the lateral faces is limited by the area of these faces considering, in particular, the necessary pitch. This limit to the number of conductors accordingly limits the number of routable signals.

Another solution exists for connecting a first chip, provided with connection pads and situated on the lower face of a first slice, with a second chip, also provided with connection pads and situated opposite the first chip, on the upper face of a second slice situated below the first one: the pads of the first chip comprise pointed protrusions. For both chips, the aluminum pads, of thickness approximately 0.2 µm, are conventionally covered with a very hard layer of natural aluminum oxidation of a few tens of Angstroms. The thickness of the protrusions of the first chip is approximately 30 µm. In order to connect the two chips, they are superimposed and then compressed such that the protrusions of one of them embed in the pad of the other. This solution makes it possible to reduce the connection length and makes it possible to avoid the limit on the number of routable signals but the number of slices of the module is intrinsically limited to two. This solution has another disadvantage. In order that the electrical connection may be produced, the pressure must be sufficient for the protrusions to traverse the very hard oxidation layer. In certain cases, considering the slight thickness of the pad, the pressure produces a crack in the chip.

Another solution exists which relates to the particular case of a stack of chips which, furthermore, are specific chips. Each chip comprises, on one face, a male connector, in this instance a protrusion with a hard point and, one the other face, a traversing electrode which constitutes a female connector. The protrusion and the electrode are formed from the silicon which constitutes the chip. When the chips are superimposed in order to produce the module, the protrusion of one chip embeds in the electrode of the other chip in such a way as to obtain the electrical connection. This connection is obtained only at the cost of extreme positioning precision. Moreover, the module obtained is expensive to produce because of the high cost of each chip, which is specific, and it cannot be produced with commercial chips or with passive components.

SUMMARY OF THE INVENTION

The purpose of the invention is to produce a 3D module which does not have the abovementioned disadvantages.

More precisely, the subject of the invention is a 3D electronic module comprising a stack of at least a first slice and a second slice, the first slice having on one face at least one set of electrically conductive protrusions and the second slice comprising at least one zone of electrically insulating material, traversing the thickness of the slice. It is principally characterized in that the second slice comprises at least one electrically conductive element traversing said slice in a zone of electrically insulating material and able to receive a set of protrusions of the first slice.

In this way, a module is obtained which is not limited in number of slices, which has a short electrical connection between two slices, even at the center of them, and a high electrical connection density since the number of routable signals is not limited.

It is inexpensive because it can be produced with commercial chips.

Preferably, the first slice comprises at least one electronic component provided on said face with an electrical connection element of the component and this connection element is connected to a set of protrusions.

According to one feature of the invention, the element is connected directly to a set and via a conductive track.

The first slice possibly comprises at least one zone of electrically insulating material, traversing the thickness of the slice, and at least one electrically conductive element traversing said slice in a zone, connected to a set of protrusions of the first slice. On the other face opposite to that which has protrusions, this first slice possibly comprises at least one electrically conductive track connected to an element traversing said slice.

According to another feature of the invention, the second slice having a face able to receive the set of protrusions of the first slice, called the receiving face, this slice has on a face opposite to the receiving face, at least one electrically conductive track connected to a traversing element.

Advantageously, the second slice comprises at least one electronic component provided on said opposite face with an electrical connection element of the component possibly connected to a conductive track of the second slice.

According to one embodiment of the invention, the second slice comprises at least one set of electrically conductive protrusions situated on the opposite face and connected to at least one conductive track of said slice.

Preferably, it furthermore comprises at least one intermediate slice which is a first slice for the second slice and/or which is a second slice for the first slice.

This intermediate slice comprises at least one component and/or at least one electrically conductive track.

According to a feature of the invention, the traversing element or elements comprise metal or a metal alloy or an electrically conductive adhesive or an electrically conductive polymer.

The metal or the metal alloy is preferably unoxidizable; it is for example gold or palladium.

According to another feature of the invention, the protrusions comprise nickel. Their surface is for example made of gold or of palladium. They have a height of between 5 and 200 μm and a cross-section of between 10 and 2500 μm².

The traversing element advantageously has a substantially circular cross-section whose diameter is substantially equal to 100 μm.

A set of protrusions comprises for example between 1 and 500 protrusions.

The 3D module according to the invention typically comprises from 2 to 100 slices.

A slice preferably has a thickness of between 25 μm and 3 mm.

The traversing element of a slice and the protrusions are respectively constituted by a material having a specified hardness; the hardness of the material of the traversing element is less than that of the material of the protrusions and capable of minimizing the pressure applied for the protrusions of another slice to penetrate into the traversing element.

In order to produce the 3D module, the slices are superimposed and pressed upon each other. Because of the low hardness of the material of the traversing element, the protrusions penetrate easily into the traversing element facing them and it is not therefore necessary to apply high pressure. The components do not therefore risk being cracked or made mechanically fragile during this stage.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

In each of the figures, the same elements are indicated by the same references.

Firstly, a module will be considered which comprises a stack of two slices, a first slice and a second slice.

Figure 2:
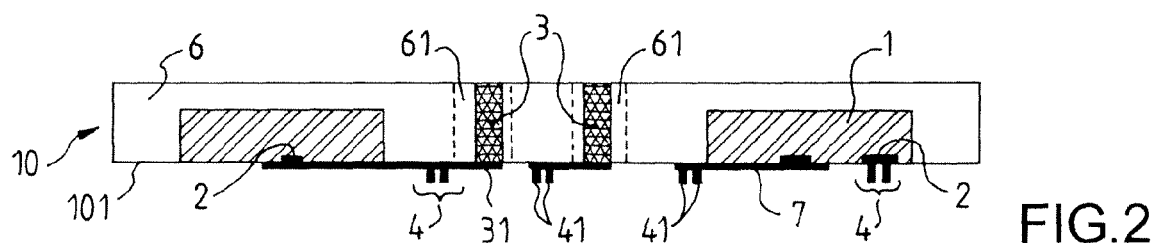
FIG. 2 is a diagrammatic representation of an example of a first slice of a 3D module according to the invention.

According to the invention, the first slice 10, an example of which is described in FIG. 2, comprises one (or more) sets 4 of electrically conductive protrusions 41, on a face 101.

Figure 1:
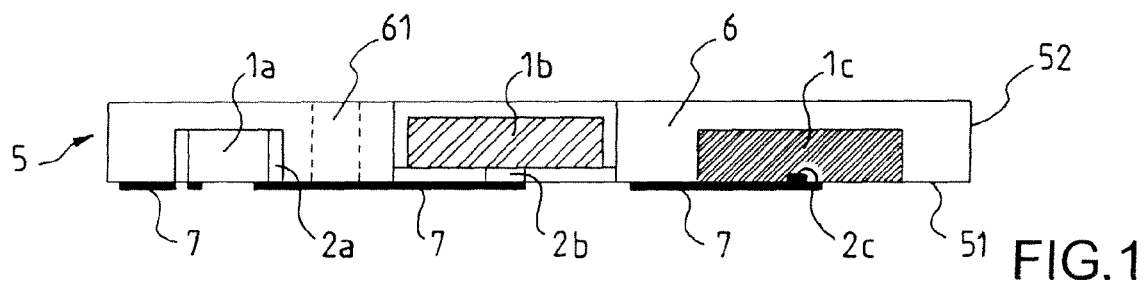
FIG. 1, already described, is a diagrammatic representation of a slice of a 3D module according to the prior art.

Preferably, this slice furthermore comprises at least one electronic component 1. It is an active component or a passive component 1a such as a capacitor, an electrical resistor, a connector, etc. The active component is for example a bare chip 1c or a chip 1b included in a protective housing for example made of plastic. The component can be a sensor such as a surface wave filter or an actuator. An electronic component 1 will be considered, in a general manner, in the following text. Each component 1 is provided with one or more electrical connection elements. An electrical connection element 2 is for example a pad 2c, a wire 2b or a ball constituted from an electrically conductive material. This element runs over the face 101 of the slice 10, even when it is disposed on the lateral sides of the component as illustrated in FIG. 1 by the reference 2a.

The slice 10 also comprises on this face 101 one or more conductive tracks 7, as already mentioned in the preamble.

The set 4 of protrusions is connected to an electrical connection element 2 of an electronic component 1 directly or via a conductive track 7.

As shown in FIG. 2, the component 1 is usually clad with an electrically insulating material 6 such as a dielectric polymer like, for example, epoxy resin. There therefore exists, in the first slice, zones 61 which comprise only this material 6 traversing the slice from one face to the other, through the thickness of the slice. According to a variant of the invention, the first slice 10 comprises at least one electrically conductive element 3 traversing this slice from one side to the other in a zone 61; this element 3 is connected to a set 4 of protrusions disposed on the face 101. The latter are directly disposed on the element 3 or are connected to it via a conductive track. This track is possibly itself connected to a connection element of another component of the same slice. This first slice possibly comprises one or more electrically conductive tracks disposed on the face opposite to the face 101.

The zone 61 of insulating material has a dielectric constant which can be adapted locally around the traversing element 3; this amounts to saying that the material is possibly itself constituted from several insulating materials.

Figure 3A:
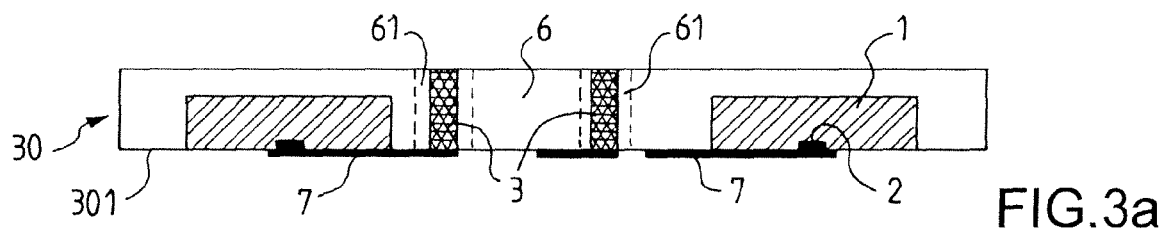
FIGS. 3a and 3b are diagrammatic representations of two examples of a second slice of a 3D module according to the invention.

The second slice 30, an example of which is described in FIG. 3a, comprises at least one electrically insulating zone 61 traversing the slice from one side to the other through its thickness, and at least one electrically conductive element 3 traversing this slice in this zone 61. This traversing element 3 is intended to receive the set 4 of protrusions of the first slice 10. The face 302 of the slice intended to receive these protrusions is called the receiving face. According to one embodiment, this face 302 possibly comprises at least one conductive track.

Figure 3B:
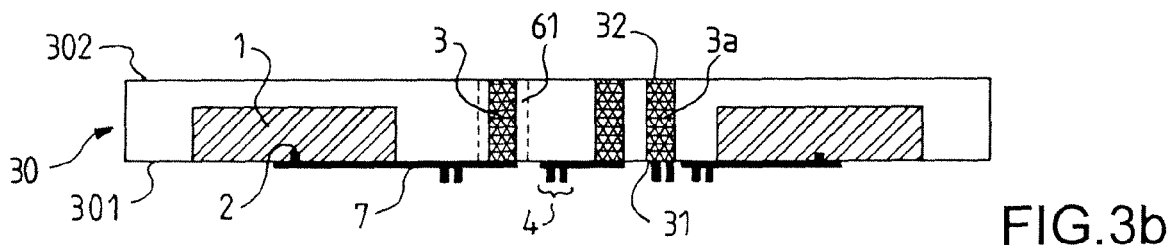

According to a variant of the invention, an example of which is shown in FIG. 3b, the second slice 30 comprises, on the face 301 opposite the receiving face, at least one set 4 of protrusions 41. The latter are connected to the traversing element 3 directly, as shown by the reference 3a of FIG. 3b, or via a conductive track 7. This second slice 30 possibly comprises one (or more) electronic components 1 provided with a connection element 2 connected via a conductive track 7 to another electronic component 1 and/or to a traversing element 3 and/or to a set 4 of protrusions.

This second slice can be intended to be connected to an interconnecting element of the 3D module via its protrusions 41 and/or its conductive tracks 7.

Figure 4:
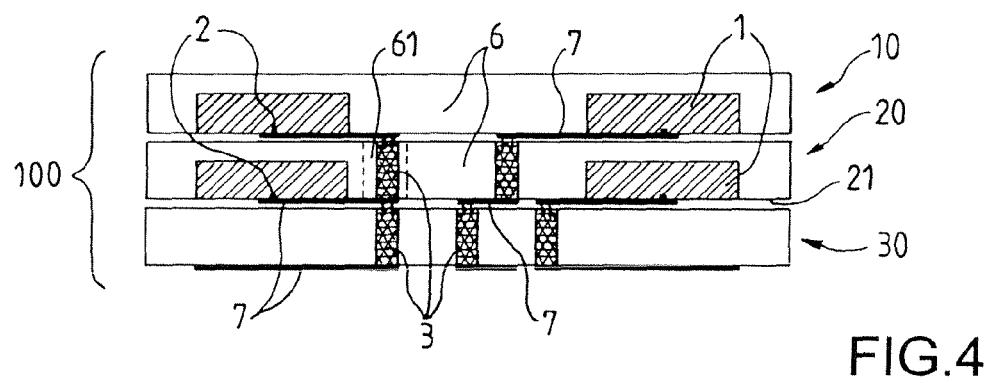
FIG. 4 is a diagrammatic representation of an example of a 3D electronic module according to the invention, comprising three slices.

According to another embodiment described with reference to FIG. 4, the stack 100 of the 3D module comprises, in addition to these first and second slices 10 and 30, at least one intermediate slice 20 which is itself equipped with at least one conductive element 3 traversing a zone 61 of electrically insulating material. In a way similar to the description of the second slice 30, this slice 20 comprises a receiving face and a face 21 opposite to this receiving face. The element 3 is itself connected to a conductive track 7 of the face 21 of this slice. It possibly comprises components 1 and/or protrusions 41. This intermediate slice is a first slice for the second slice and/or a second slice for the first slice.

The 3D module according to the invention typically comprises from 2 to 100 slices. A slice has a thickness of between 25 μm and 3 mm. It is of course itself intended to be connected to another 3D module or to other interconnection media.

The traversing element 3 is constituted from a material whose hardness makes it possible to minimize the pressure applied for the protrusions 41 of one slice to penetrate easily into the traversing element; the hardness of the material of the traversing element is lower than that of the material of the protrusions 41. This traversing element 3, which is solid, has for example the shape of a cylinder of circular, rectangular or other cross-section. The cross-section is in the plane of the faces 101 or 301 or 21. Its area is between 10 and 2500 μm².

This element 3 comprises, for example, metal or a metal alloy or an electrically conductive adhesive or an electrically conductive polymer. The metal or the metal alloy is preferably unoxidizable. This metal can be gold or palladium, which has the advantage of being of low hardness. This hardness can be adapted.

The protrusions 41 measure, for example, between 2 and 200 μm in height. A protrusion has, for example, the shape of a cylinder of circular, rectangular or other cross-section or of a cone or of a pyramid. The maximum length of the cross-section considered in the plane of the faces 101 or 301 or 21 is about 5 to 50 μm. They are for example constituted of nickel; they are preferably coated with gold or with palladium and thus form hard points. A set 4 of protrusions 41 comprises between 1 and 500 protrusions.

The contact surface of a set 4 of protrusions with that of an element 3 is now considered. Preferably, a number of protrusions is preferably chosen such that all of these protrusions together exhibit at their base an area less than that of the element 3: a better tolerance in the positioning of one slice upon the other is obtained in this way than in the case where it is necessary to position one chip upon the other with precision as in the prior art.

In order to produce the 3D module, the slices are pressed upon each other. During this stage, the protrusions 41 with hard points penetrate into the traversing element 3 facing them and having hardness lower than that of the protrusions and thus provide an electrical contact between the two slices. It is therefore no longer necessary to traverse a layer of natural hard aluminum: the pressure can therefore be reduced and the components 1 do not risk being cracked during this stage. Moreover, when the protrusions 41 are offset with respect to the components 1, the latter are at even less risk of becoming cracked.

When the material of the traversing element, gold or palladium in this instance, is the same as that which coats the protrusions, there is no intermetallic creation which has the disadvantage of aging poorly and of being fragile: the reliability of the connection is therefore improved.

The 3D module according to the invention can be equipped with an electromagnetic screen.

Moreover, it can be produced using conventional mass-production techniques, known to those skilled in the art.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A 3D electronic module comprising:
a stack having a first slice and a second slice,
wherein each of the first and second slices has
    several electronic components;
    an electrically insulating resin clad with the electronic components; and
    electrical connection elements on a face of the slice,
wherein the first slice further includes, on said face of the first slice,
    a set of electrically conductive protrusions, and
    an electrically conductive track,
wherein at least one of said electrical connection elements is connected to the set of electrically conductive protrusions via the electrically conductive track,
wherein the first slice has, between two of the electronic components, a zone of electrically insulating material, traversing a thickness of the first slice,
wherein the second slice has
    a zone of electrically insulating material traversing a thickness of the second slice, and
    an electrically conductive element traversing said second slice in the zone of electrically insulating material, and
wherein the electrically conductive element and the electrically conductive protrusions are respectively constituted by a material having a specified hardness, the hardness of the material of the electrically conductive element being less than that of the material of the electrically conductive protrusions, and
wherein the set of the electrically conductive protrusions of the first slice is embedded into the electrically conductive element of the second slice.

2. The 3D electronic module as claimed in claim 1, wherein the first slice further comprises at least one electrically conductive element, traversing said first slice in the zone of electrically insulating material, connected to of the set of the electrically conductive protrusions of the first slice.

3. The 3D electronic module as claimed in claim 2, wherein the first slice has another face opposite to the face having the set of the electrically conductive protrusions, and
    wherein the first slice further comprises, on said face having the set of the electrically conductive protrusions, at least one electrically conductive track connected to said at least one electrically conductive element traversing said first slice.

4. The 3D electronic module as claimed in claim 1, wherein the second slice has a receiving face to receive the set of electrically conductive protrusions of the first slice, and
    wherein the second slice further has, on another face opposite to the receiving face, at least one electrically conductive track connected to the electrically conductive element.

5. The 3D electronic module as claimed claim 4, wherein at least one of the electronic components of the second slice is arranged on said another face, with said electrical connection element of the second slice.

6. The 3D electronic module as claimed claim 5, wherein the second slice further comprises a conductive track connected to the electrical connection element of the second slice.

7. The 3D electronic module as claimed claim 6, wherein the second slice comprises at least one set of electrically conductive protrusions situated on the another face and connected to at least one conductive track of said second slice.

8. The 3D electronic module as claimed in claim 1, further comprising at least one intermediate slice situated between the first and second slices,
- wherein said at least one intermediate slice includes
- at least one zone of electrically insulating material;
- at least one of the electrically conductive element traversing said zone; and
- at least one set of electrically conductive protrusions, and
- wherein said at least one intermediate slice is a first slice for the second slice and/or a second slice for the first slice.

9. The 3D electronic module as claimed in claim 8, wherein the intermediate slice further comprises at least one electrically conductive track.

10. The 3D electronic module as claimed in claim 1, wherein the electrically conductive element or a plurality of the electrically conductive elements comprise one of metal, a metal alloy, an electrically conductive adhesive, or an electrically conductive polymer.

11. The 3D module as claimed in claim 10, wherein the metal or the metal alloy is unoxidizable.

12. The 3D electronic module as claimed in claim 11, wherein the metal is gold or palladium.

13. The 3D module as claimed in claim 1, wherein the electrically conductive element or a plurality of the electrically conductive elements are solid.

14. The 3D electronic module as claimed in claim 1, wherein the protrusions comprise nickel.

15. The 3D electronic module as claimed in claim 1, wherein the protrusions include a surface which is made of gold or palladium.

16. The 3D electronic module as claimed in claim 1, wherein the connection element or a plurality of the connection elements are pads, wires, or connection balls.

17. The 3D electronic module as claimed in claim 1, wherein the protrusions have a height of between 5 and 200 µm.

18. The 3D electronic module as claimed in claim 1, wherein the protrusions have a cross-section of between 10 and 2500 µm$^2$.

19. The 3D electronic module as claimed in claim 1, wherein the electrically conductive element has a substantially circular cross-section and
- wherein a diameter of the substantially circular cross-section is substantially 100 µm.

20. The 3D electronic module as claimed in claim 1, wherein the electronic component is an active or passive component.

21. The 3D electronic module as claimed in claim 1, wherein the electronic component is a sensor or an actuator.

22. The 3D electronic module as claimed in claim 1, wherein a set of protrusions comprises between 1 and 500 protrusions.

23. The 3D electronic module as claimed in claim 1, wherein the insulating material is a polymer.

24. The 3D electronic module as claimed in claim 1, wherein the zone of insulating material comprises several insulating materials having different dielectric constants to adapt the dielectric constant locally around the traversing electrically conductive element.

25. The 3D electronic module as claimed in claim 1, comprising from 2 to 100 slices.

26. The 3D electronic module as claimed in claim 1, wherein each of the first and second slice has a thickness between 25 µm and 3 mm.

* * * * *